United States Patent [19]
Brady

[11] Patent Number: 5,510,726
[45] Date of Patent: Apr. 23, 1996

[54] ARMATURE TESTER

[75] Inventor: Robert H. Brady, Ardmore, Okla.

[73] Assignee: R. E. Phelon Co., Inc., Aiker, S.C.

[21] Appl. No.: 153,312

[22] Filed: Nov. 17, 1993

[51] Int. Cl.[6] ............................ G01R 31/06; G01R 31/34
[52] U.S. Cl. ............................................. 324/772; 324/545
[58] Field of Search ...................................... 324/545, 546, 324/772; 29/733, 597

[56] References Cited

U.S. PATENT DOCUMENTS

| 3,307,102 | 2/1967 | Norkaitis | 324/545 |
| 3,819,046 | 6/1974 | Klema et al. | 324/545 |
| 4,005,347 | 1/1977 | Erdman | 318/138 |
| 4,053,830 | 10/1977 | Porter | 324/545 |
| 4,577,399 | 3/1986 | Ott | 29/733 |
| 4,766,387 | 8/1988 | Browne et al. | 324/545 |
| 5,126,658 | 6/1992 | Twerdochlib | 324/545 |
| 5,140,276 | 8/1992 | Fisher | 324/545 |

*Primary Examiner*—Ernest F. Karlsen
*Attorney, Agent, or Firm*—James E. Bradley; Mark W. Handley

[57] ABSTRACT

A method and apparatus are provided for determining angular alignment between a lamination stack, a commutator, and coil windings of an armature for an electric motor. The apparatus has a body with an aperture for extending about the commutator, and a post for fitting into the lamination stack to locate an indicator slot and graphic symbols relative to the lamination stack for visually comparing alignment between the lamination stack, the commutator, and the coil windings.

22 Claims, 1 Drawing Sheet

ARMATURE TESTER

BACKGROUND OF THE INVENTION

1. Field of the Invention

This invention relates in general to the field of testing for proper assembly of armatures for electric motors, and more particularly to tester equipment for assuring proper alignment between a commutator, a lamination stack, and coil windings for an armature.

2. Description of the Prior Art

In the manufacture of armatures for electric motors, two cylindrical parts called the commutator and the lamination stack are pressed onto a central motor shaft. The commutator and the lamination stack have several radially cut slots running the length of the parts along their outside surfaces. Typically, the commutator and lamination stack must be maintained in angular alignment so that the slots in the lamination stack and the slots in the commutator are aligned within a specified tolerance for proper assembly and operation of the armature. A typical specified tolerance is that these parts are aligned to within plus or minus three degrees from an optimal positioning, or, in other words, within a total tolerance of six degrees.

Prior art devices have been used to test the angular alignment between a commutator and a lamination stack. These prior art devices typically operate by keying on one of the lamination stack slots to locate the armature within the device, and then using an opto-electric sensor to check the angular alignment between a corresponding slot in the commutator. This device requires a sensor, a power supply to drive it, and considerable fixturing and tooling.

Further, in assembling an armature, after the lamination stack, the commutator, and some small insulating parts are in place, a series of coils of insulated wire are typically wound onto the armature assembly using automated equipment, such as, for example, a "double flyer" type of automatic armature winding machine. Using a 16-bar armature as an illustrative example, a typical automatic armature winding machine will hook two wires onto two commutator tangs on opposite diametrical sides of the commutator, and begin winding coils with one wire on each side of the armature wrapped through two lamination stack slots and then back to an adjacent commutator tang. The automated machine will then wind through the next two lamination stack slots and back to the adjacent commutator bar, and then continue winding the rest of the coils until the wire that began at a first commutator bar will terminate at a ninth commutator bar. In this illustrative example, an armature will be completely wound when eight coils are wound on each side.

After winding, it is necessary to determine if the automatic winding machine selected the proper lamination stack slots to wind the wires within. Determination of proper winding of an armature has been done by prior art devices, some similar to the one mentioned above. Typically, the armature is keyed to locate the prior art device about the armature, and a voltage is applied across two commutator bars which are 180 degrees apart to create a magnetic field in the armature similar to one which would be present in actual operation of the armature in a motor. Magnetic sensors are then used to determine the position of the magnetic field created by the coils. If the magnetic field appears in the correct place, then the coils should be properly wound. This prior art device requires a power supply to excite the armature coils, another to excite a magnetic sensor, a magnetic sensor, and considerable tooling and fixturing to perform the test.

The two prior art devices described above are rather costly and require a skilled technician to set up each time an assembly line shifts from making one armature to another. Typically, only the first part in each production run is tested. If the setup on this first part of such an automated process is good, the rest of the parts assembled during the production run should turn out to be good as well.

SUMMARY OF THE INVENTION

A method and apparatus are provided for determining angular alignment between a lamination stack, a commutator, and coil windings of an armature for an electric motor. The apparatus has a body with an aperture for extending about the commutator, and a post for fitting into the lamination stack to locate an indicator slot and graphic symbols relative to the lamination stack for visually comparing alignment between the lamination stack, the commutator, and the coil windings.

BRIEF DESCRIPTION OF THE DRAWING

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
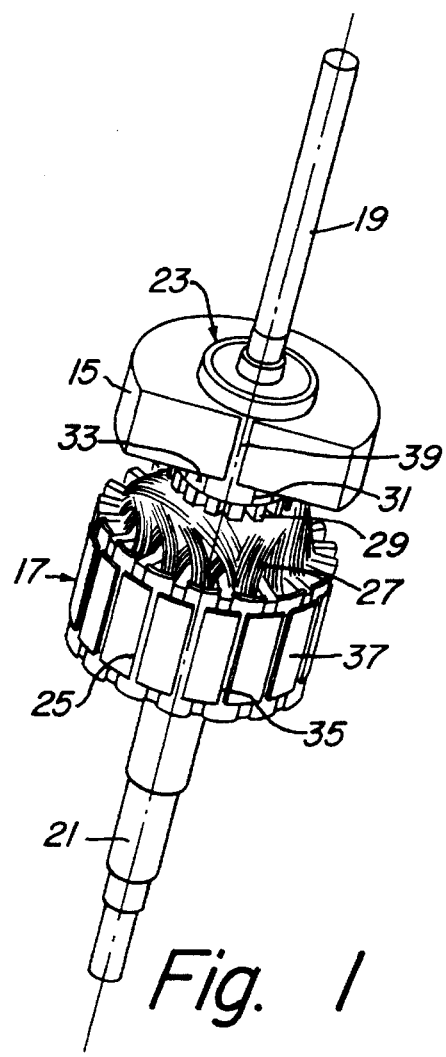
FIG. 1 is a perspective view of the armature tester of the preferred embodiment of the present invention which is shown positioned about an armature of an electric motor.

Referring to FIG. 1, armature tester 15 is shown positioned and located on armature 17. Armature tester 15 of the preferred embodiment of the present invention is designed to test a specific armature, armature 17. Armature 17, as depicted herein for illustrative purposes, is intended for use in a D.C. motor. However, the present invention may be used for testing other types of armatures, such as armatures which are intended for other uses.

Armature 17 includes motor shaft 19 having longitudinal axis 21, about which commutator 23 and lamination stack 25 are fixed. Longitudinal axis 21 provides a central axis for armature 17. Commutator 23 and lamination stack 25 are each concentrically disposed about longitudinal axis 21. Coil windings 27 extend from tangs 29 on commutator 23 and around portions of lamination stack 25.

Commutator 23 has sixteen commutator slots 31 which extend between commutator bars 33, and an outermost diameter of 0.870 inches. Lamination stack 25 has sixteen lamination stack slots 35 which extend between lamination stack poles 37, and an outermost diameter of 1.812 inches. Commutator slots 31 have a width of 0.020 inches, and lamination stack slots 35 have a width of 0.080 inches. Armature 17 includes sixteen individual coil windings 27, for eight pairs of coil windings, which are formed by winding two separate strands of insulated wire about lamination stack 25 with an automated winding machine.

Figure 2:
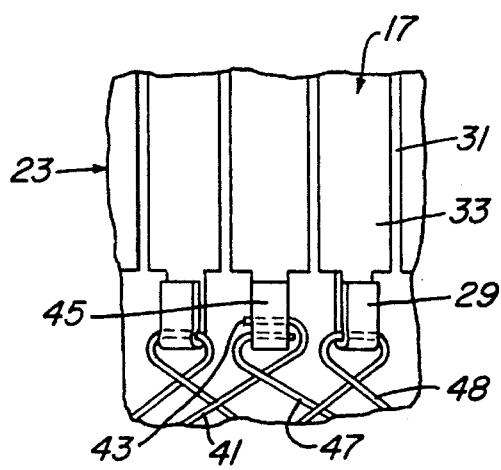
FIG. 2 is a sectional view of the armature shown in FIG. 1, and depicts a portion of a commutator of the armature.

Referring to FIG. 2, a sectional view of armature 17 depicts a portion of commutator 23. Commutator slots 31 are shown extending between commutator bars 33. Tangs 29 extend from commutator bars 33. Wire 41 terminates at tang 45, having terminal wire end 43. A second wire, wire 47, also terminates at tang 45 and has terminal wire end 48. Wires 41 and 47 extend from tang 45 and wrap about lamination stack 25 to form coil windings 27 (shown in FIG. 1). Wire 47 is connected to tang 45 prior to wrapping about lamination stack 25, and wire 41 is connected to tang 45 after wrapping around lamination stack 25. Each individual coil winding is formed from one of wires 41 and 47, which are looped back through one of tangs 29 between each individual coil of coil windings 27.

Figure 3:
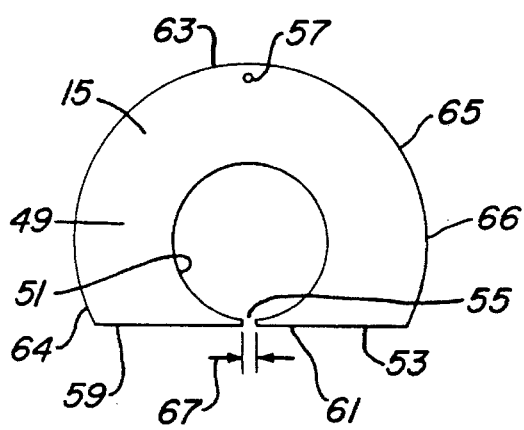
FIG. 3 is top view of the armature tester of FIG. 1.

Referring to FIG. 3, a top view of armature tester 15 is shown. Armature tester 15 has body 49 which is formed from a ring of nylon, a thermoplastic, having an outermost diameter of 2.0 inches, and a thickness of 0.50 inches. Aperture 51 extends through body 49 to provide an internal diameter of 0.875 inches. Body 49 provides a positioning member for positioning armature tester 15 exteriorly about armature 17 (shown in FIG. 1). Armature tester 15 has flat 53 which is 0.50 inches from the center of aperture 51. Indicator slot 55 extends perpendicular to flat 53 and into aperture 51 in line with the center of aperture 51. Indicator slot 55 provides an indicator for marking a location on body 49 of tester 15.

Figure 4:
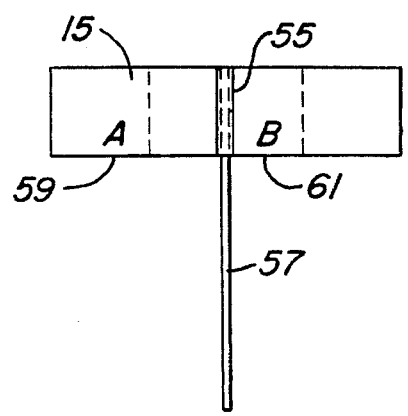
FIG. 4 is a front view of the armature tester of FIG. 1.

Referring to FIG. 4, a front view is shown of armature tester 15 of the preferred embodiment of the present invention. Armature tester 15 includes post 57 which is a pin that extends from body 49 for 1.50 inches and provides an alignment member for aligning armature tester 15 about armature 17 (shown in FIG. 1). Post 57 extends from body 49 on the opposite side of aperture 51, 180 degrees from indicator slot 55. Post 57 provides a locating means, for locating tester 15 relative to armature 17. It should also be noted that indicator slot 55 may be used as a locating means to align tester 15 with one of slots 31 of commutator 23.

In other embodiments of the present invention, alternative locating means may be used for locating armature tester 15 relative to an armature, rather than post 57. One alternative embodiment to armature tester 15 is to replace post 57 with a key for locating tester 15 relative to the armature. A key, or pin, could extend radially inward toward an armature from an alternative armature tester of the present invention, rather than parallel to a longitudinal axis of an armature as post 57 extends. The key, or pin, could extend into a slot in the armature, such as one of commutator slots 31 or lamination stack slots 35, to locate the alternative armature tester relative to the armature.

Still referring to FIG. 4, armature tester 15 further includes adhesive labels at positions 59 and 61, which provide graphic symbols, or indicators, for marking locations about armature tester 15. Positions for other adhesive labels are shown in FIG. 3, at positions 63 through 66. Referring to FIG. 3, position 59 is disposed 45 degrees to the left of indicator slot 55, and position 61 is disposed 11¼ degrees to the right to slot 55. Position 63 is disposed 180 degrees from position 61, which is 11¼ degrees from post 57. Positions 61 and 63 are for positioning next to the stop and start tangs, of tangs 29, such as tang 45 (shown in FIG. 2), in positioning and locating tester 15 relative to armature 17.

Positions 59, and 64 through 66 are for identifying the slots of lamination stack slots 35 through which are wrapped the outermost coils of coil windings 27. Position 64 is disposed 67½ degrees to the left of indicator slot 55, and 22½ degrees to the left of position 59. Position 65 is disposed 135 degrees to the right of slot 55, and 45 degree from post 57. Position 66 is disposed 112½ degrees to the right of slot and 22½ degrees from position Indicator slot 55 has a slot width 67 which extends circumferentially around the outer periphery of commutator 23 at aperture 51 for a distance in which slot 39 of commutator slots 31 will line up with indicator slot 55 for a range of rotation between armature tester 15 and commutator 23 which is equal to an acceptable tolerance for alignment between commutator 23 and lamination stack 25. In the preferred embodiment of the present invention, an acceptable tolerance for an angular alignment about longitudinal axis 21 between commutator 23 and lamination stack 25 is that they are angularly aligned to within plus or minus three degrees of an optimal alignment, in which commutator slot 39 is centered with slot 55.

Referring to FIGS. 1, 2 and 3, armature tester 15 of the preferred embodiment is set up for determining whether coil windings 27 are properly wound about lamination stack 25 by positioning armature tester 15 over the commutator of a known good armature. Post 57 is fit inside one of lamination stack slots 35 adjacent to the one of the two commentator bars 33 where the wire starting and stopping ends are located. There are two of commutator bars 33 where the wire stopping and starting ends are located since armature 17, which is a particular model of armature which armature tester 15 of the preferred embodiment of the present invention was specifically designed to test, is wound using a "double flyer" automatic armature winding machine to simultaneously wind two separate insulated wires 41 and 47 about armature 17 to provide coil windings 27. The wire stopping and starting ends can be identified by noting which tangs of commutator bars 31 have wire ends extending from them such as tang 45 in FIG. 2.

Referring to FIGS. 3 and 4, the two positions where the wire starting and stopping ends are located are identified by placing adhesive labels on the outer circumferentially periphery, or the outer circumference, of body 49 adjacent to the two stop-start positions, one of which is position 63 (not visible in FIG. 4) adjacent to post 57, and the other of which is position 31, indicated by letter B (shown in FIG. 4).

The stopping end for each of the two wires are then traced from the two tangs, one of which is tang 45, to determine which of lamination stack slots 35 the last coil for each wire was wound in. The positions of these four slots of lamination stack slots 35, two for each of wires 41 and 47, are then indicated by placing two sets of adhesive labels on the outer circumference of body 49. The lamination slots for the last coil of one wire is labelled at positions 64 and 65 on the circumference of body 49, and the lamination slots for the last coil of the other wire are labelled at positions 59 and 66, of which position 59 is indicated by the letter A (shown in FIG. 4).

Armature tester 15 can now be used to test other armatures of the same particular model as armature 17 by positioning aperture 51 of body 49 over the outer circumference of a commutator of an untested armature so that post 57 enters one of the two of lamination stack slots 35 with positions 61 and 63 located next to the two wire start-stop commutator bars. Aperture 51 is placed about commutator 23 for positioning body 49 of armature tester 15 concentrically about longitudinal axis 21 of motor shaft 19. Inserting post 57 into one of the two particular slots of lamination slots 35, next to which one of wires 41 or 47 terminate, locates armature tester 15 relative to lamination stack 25 and commutator 23. The two particular slots of lamination stack slots 35 are identified by matching indicator marks at positions 61 and 63 with the two tangs of tangs 29 at which wires 41 and 47 terminate, such as matching label 61 with tang 45.

Angular alignment between commutator slots 31 and lamination stack slots 35 can now be checked by observing the position of commutator slot 39, which is the one of commutator slots 31 which is visible within indicator slot 55. If commutator slot 39 does not touch either side of indicator slot 55, then commutator slots 31 are properly aligned with lamination slots 35. Thus commutator 23 is angularly aligned with lamination stack 25 to within plus or minus three degrees of rotation about longitudinal axis 21.

Next, angular alignment between coil windings 27 and commutator 23 about longitudinal axis 21 may be checked. Since wires 41 and 47 are wound around lamination stack 25 to form coil windings 27 in a programmable, automated winding machine, if the last coil for each wire is properly wound, the rest of the coils should also be properly wound. Other assembly problems with alignment of the wraps should be visible by visual inspection of armature 17. Thus, whether coil windings 27 are properly aligned with respect to commutator 23 may be checked by checking the outermost coil windings for each of the wires 41 and 47, which were wrapped about lamination stack 25 to form coil windings 27.

The outermost two wire ends of wires 41 and 47 are traced to determine the outermost, or last wound, of coil windings for each of the two wires. These outermost two coil windings are also identifiable by visually inspecting to determine which two windings of coils windings 27 lie on top of the others of coil windings 27, that is, which two wraps are outside of the rest of coil windings 27. Then the numeric labels placed on the outer circumference of body 49, at positions 59 and 66, and positions 64 and 65, are visually compared for alignment with the four of lamination slots 35 through which the outermost coil windings pass to determine angular alignment between commutator 23 and coil windings The present invention offers several advantages over the prior art. The present invention is less expensive since it does not include costly electronic or optical equipment for verifying angular alignment between the commutator, the lamination stack, and coil windings of an armature. Further, assembly of the armature can be quickly and visually checked to assure that the commutator is aligned with the lamination stack, and that the coil windings are properly aligned with the appropriate commutator tangs for operation of the armature within an electric motor. A minimally trained operator can determine whether the commutator, lamination stack, an coil windings are angularly aligned about the motor shaft of the armature.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

What is claimed is:

1. An apparatus for determining angular alignment between two components located on a shaft of an armature, the components of the armature including a commutator having commutator slots, a lamination stack having lamination slots, and a plurality of coil windings which are disposed about the lamination stack, the apparatus comprising:

a positioning member body having an aperture for closely receiving a portion of the armature;

means including an extending member mounted to the positioning member body which inserts into one of the slots of a first one of the components when the portion of the armature is closely received within the body for angularly locating the apparatus relative to the first one of the components; and an indicator gap on the positioning member body angularly spaced from the extending member for exposing a selected one of the slots on a second one of the components for visually determining the angular alignment between the first and second ones of the components.

2. The apparatus of claim 1, wherein the aperture of the positioning member body is adapted to closely receive the commutator.

3. The apparatus of claim 1, wherein the lamination stack is the first one of the components, and the extending member extends from the positioning member body parallel to an axis of the aperture and into one of the lamination slots.

4. The apparatus of claim 1, wherein the indicator gap is positioned to expose one of the slots of the commutator when the extending member is located within one of the slots of the lamination stack.

5. The apparatus of claim 1, further comprising:

the indicator gap having a gap width within which one of a commutator slot and a lamination slot will appear when the commutator is aligned with the lamination stack; and the indicator gap having the gap width selected so that at least a portion of the one of the commutator slot and the lamination slot will not be visible within the indicator gap when the angular alignment between the commutator and the lamination stack is not within acceptable tolerances.

6. The apparatus of claim 1, further comprising:

a flat cut into the positioning member body adjacent to the indicator gap, parallel to a central axis of the aperture and spaced apart from the central axis of the aperture a selected distance; and the flat being angularly aligned around the central axis of the aperture with the indicator gap, to center the indicator gap within the flat.

7. An apparatus for determining angular alignment between a commutator having a plurality of commutator slots and a lamination stack of an armature for an electric motor, the lamination stack having a plurality of lamination slots containing coil windings, the apparatus comprising:

a body having an aperture extending therein for closely receiving the commutator;

an extending member which extends from the body for fitting into one of the lamination slots within the lamination stack for locating the apparatus relative to the lamination stack when the body is fitted about the commutator; and the body including an indicator gap formed therein to extend parallel to one of the commutator slots for providing a visual indication for comparing to the one of the commutator slots to determine the angular alignment between the commutator and the lamination stack when the body is fitted about the commutator and the apparatus is located relative to the lamination stack.

8. The apparatus of claim 7, wherein the indicator gap has a greater width than the commutator slot within an acceptable tolerance for the angular alignment.

9. The apparatus of claim 7, wherein the commutator has a winding tang for each of the lamination slots, at least one of which is a start-stop winding tang for the coil windings, and wherein the apparatus further comprises:

a first graphic symbol positioned on the body for alignment with the start-stop winding tang of the commutator; and a second graphic symbol positioned on the body at an angular location from the first graphic symbol for visually tracing a portion of the coil windings from the start stop tang to a selected one of the lamination slots and comparing the angular alignment of the second graphic symbol and the selected one of the lamination slots for determining an angular alignment about the longitudinal axis for said portion of the coil winding with respect to the commutator.

10. The apparatus of claim 7, wherein the body includes an exterior surface which comprises:

a cylindrical portion which extends partially circumferentially around a longitudinal axis of the aperture; and a flat portion formed into one side of the body and intersecting the aperture to define a slot which provides the indicator gap.

11. An apparatus for use with an armature having a commutator, a lamination stack and coil windings to determine angular alignment between the commutator and the coil windings, wherein the coil windings are wrapped around the lamination stack, placed in lamination slots which are spaced apart around the lamination stack, and the commutator has a plurality of tangs, one for each lamination slot, said apparatus comprising:

a body having an aperture extending therein for closely receiving a portion of the armature;

means for angularly locating the apparatus relative to the commutator to angularly align the apparatus about a longitudinal axis of the armature; and a first graphic symbol defining a location on the body for visually comparing to a particular one of the coil windings to determine the angular alignment, about the longitudinal axis, between the coil windings which are disposed on the lamination stack and the commutator.

12. The apparatus of claim 11, wherein the means for angularly locating the apparatus relative to the commutator comprises:

an extending member which extends from the body for fitting into a slot in one of the commutator and the lamination stack for locating the apparatus relative to the commutator.

13. The apparatus of claim 1, wherein:

the aperture closely receives the commutator;

the means for angularly locating the apparatus relative to the commutator further comprises an extending member which extends from the body for fitting into an alignment slot within the lamination stack for locating the apparatus relative to the lamination stack; and an indicator gap is formed in the body for verifying angular alignment between the lamination stack and the commutator by visually comparing the indicator gap to a slot extending between commutator bars.

14. An apparatus for determining angular alignment between a commutator and a lamination stack about a central axis of an armature for an electric motor, and for determining a positioning of coil windings about the lamination stack, wherein the coil windings are wrapped around the lamination stack, placed in lamination slots which are spaced apart around the lamination stack, and the commutator has a plurality of tangs around which a portion of the coil windings are wrapped and then extended to the lamination slots, at least one of the tangs providing a start-stop commutator tang for the coil windings, said apparatus comprising:

a body having an aperture with a longitudinal axis extending therethrough for closely receiving the commutator, and an indicator mark for aligning the body with the start-stop commutator tang;

an extending member which, when the apparatus is positioned about the commutator, extends from the body in a direction which is parallel to the central axis of the armature for inserting into one of the slots within the lamination stack to angularly locate the apparatus relative to the lamination stack;

the body having an indicator gap formed therein parallel to the central axis of the armature for providing a visual indication of one of the commutator slots to determine the angular alignment between the commutator and the lamination stack when the apparatus is angularly located relative to the lamination stack; and a first graphic symbol defining a location on the body for visually comparing the positioning of the coil windings about the lamination stack and the start-stop commutator tang, when the body is aligned with the start-stop commutator tang.

15. A method for determining angular alignment between at least two components of an armature for an electric motor, the components of the armature including coil windings, a commutator having a plurality of tangs and commutator slots spaced apart around a longitudinal axis of the armature, and a lamination stack having a plurality of lamination slots spaced apart around the longitudinal axis for receiving the coil windings, the method comprising the steps of:

providing a member which has a body with an aperture, an indicator gap and an extending member which extends from the body;

positioning the member over a portion of the armature by inserting said portion through the aperture, and inserting the extending member into one of the slots of one of the components; and using the indicator gap, visually comparing an alignment of one of slots of the other of the components to the indicator gap.

16. The method of claim 15, wherein the step of positioning the member over a portion of the armature comprises the step of:

placing the commutator within the aperture, and concentrically aligning the aperture with the commutator.

17. The method of claim 16, wherein the step of positioning the member comprises the step of:

fitting the extending member within one of the lamination slots in the armature.

18. The method of claim 15, further comprising the steps of:

providing first and second graphic symbols on the body of the member, spaced angularly apart around a central axis of the body at a substantially equal angle to the angle over which one of the coil windings extends around the longitudinal axis of the armature in passing between the lamination slots and the commutator tangs;

aligning the first graphic symbol with one of the commutator tangs;

visually comparing alignment of the second graphic symbol to one of the coil windings which extends from the one of the commutator tangs, to determine an angular alignment about the longitudinal axis of the coil windings with respect to the commutator.

19. The method of claim 15, wherein the indicator gap is a slot cut through one side of the body of the member, and the step of visually comparing the alignment comprises the step of:

comparing the alignment between the indicator gap and one of the commutator slots which is aligned to appear within the indicator gap.

20. The method of claim 15, wherein the step of positioning the member over a portion of the armature comprises placing the armature within an aperture extending through the member for concentrically aligning the aperture with the longitudinal axis of the armature;

wherein the step of positioning the member further comprises fitting the extending member within one of the lamination slots in the armature and the method further comprises the steps of:

providing first and second graphic indicators on the body of the member, spaced angularly apart around a central axis of the body at a substantially equal angle to an angle over which one of the coil windings extends around the longitudinal axis of the armature in passing between the lamination slots and the commutator tangs;

visually comparing alignment of the second graphic indicator to a second side of the coil windings, opposite the first side, to determine an angular alignment about the longitudinal axis of the coil windings with respect to the commutator;

wherein the indicator gap is a slot cut through one side of the body of the member, and the step of visually comparing the alignment comprises the step of:

comparing the alignment between the indicator gap and one of the commutator slots which is aligned to appear within the indicator gap.

21. The method of claim 15, further comprising the steps of:

providing first and second graphic symbols on the body of the member, spaced angularly apart around a central axis of the body at a substantially equal angle to the angle over which a first one of the coil windings extends around the longitudinal axis of the armature in passing between the lamination slots and the commutator tangs;.

aligning the first graphic symbol with a first one of the commutator tangs;

visually comparing alignment of the second graphic symbol to a second side of the first coil windings, opposite the first side, to determine an angular alignment about the longitudinal axis of the coil windings with respect to the commutator; and providing third and fourth graphic symbols on the body of the member, spaced angularly apart around the central axis of the body at an equal angle to an angle over which a second one of the coil windings extends around the longitudinal axis of the armature in passing between the lamination slots and the commutator tangs;

visually comparing alignment of the second one of the coil windings with the third and fourth graphic symbols to determine an angular alignment about the longitudinal axis of the second coil winding with respect to the commutator.

22. The method of claim 15, further comprising the steps of:

providing first and second graphic indicators on to the body, angularly spaced apart around a central axis of the aperture at a substantially equal angle to the angle around the longitudinal axis of the armature over which a coil winding extends in passing between a lamination slot and a tang of the commutator;

aligning about the longitudinal axis of the armature the first graphic indicator with a first side of the coil winding which passes through a first one of the lamination slot and the tang, with the extending member extending into the one of the slots of the one of the components; and visually comparing alignment of the second graphic indicator to a second side of the coil winding which passes through a second one of the lamination slot and the tang to determine an angular alignment between the coil winding and the commutator.

* * * * *